United States Patent [19]

Yamazaki et al.

[11] Patent Number: 5,121,187
[45] Date of Patent: Jun. 9, 1992

[54] ELECTRIC DEVICE HAVING A LEADFRAME COVERED WITH AN ANTIOXIDATION FILM

[75] Inventors: Shunpei Yamazaki, Tokyo; Kazuo Urata, Atsugi; Itaru Koyama, Hadano, all of Japan

[73] Assignee: Semiconductor Energy Laboratory Co., Ltd., Kanagawa, Japan

[21] Appl. No.: 421,503

[22] Filed: Oct. 11, 1989

[30] Foreign Application Priority Data

Oct. 17, 1988 [JP] Japan ............... 63-261965
Oct. 17, 1988 [JP] Japan ............... 63-261966

[51] Int. Cl.⁵ .................................. H01L 23/30
[52] U.S. Cl. ............................ 357/72; 357/70
[58] Field of Search ............... 357/72, 68, 67, 71, 357/70; 174/52.5; 437/219

[56] References Cited

U.S. PATENT DOCUMENTS

| | | | |
|---|---|---|---|
| 4,396,934 | 8/1983 | Nishida et al. | 357/72 |
| 4,472,730 | 9/1984 | Ohta | 357/72 |
| 4,486,945 | 12/1984 | Aigoo | 357/72 |
| 4,711,700 | 12/1987 | Cusak | 357/70 |
| 4,758,875 | 7/1988 | Fujisaki et al. | 357/71 |
| 4,866,505 | 9/1989 | Roberts et al. | 357/67 |
| 4,872,047 | 10/1989 | Fister et al. | 357/67 |

FOREIGN PATENT DOCUMENTS

| | | | |
|---|---|---|---|
| 0250146 | 12/1987 | European Pat. Off. | 357/70 |
| 0152146 | 7/1987 | Japan | 357/72 |
| 0011337 | 1/1989 | Japan | 437/219 |

Primary Examiner—Rolf Hille
Assistant Examiner—S. V. Clark
Attorney, Agent, or Firm—Sixbey, Friedman, Leedom & Ferguson

[57] ABSTRACT

An improved electric device and a manufacturing method for the same is described. The device is for example an IC chip clothed with molding. The IC chip is mounted on a lead frame by means of an adhesive such as a glass-type silver paste which discharges little amount of gases and the rear surface of the lead frame is covered with an antioxidation film of silicon nitride.

10 Claims, 4 Drawing Sheets

ELECTRIC DEVICE HAVING A LEADFRAME COVERED WITH AN ANTIOXIDATION FILM

BACKGROUND OF THE INVENTION

The present invention relates to an electric device, especially, to an electric device which has a semiconductor chip mounted on a lead frame and is hermetically packaged.

Integrated semiconductor circuits are most important electric devices which have been broadly used in a variety of fields. One of the problems from the view point of reliability is the flowing-in of moisture or other impurities into the IC chips embedded in mounting resin. The flowing-in takes place through cracks or gaps which may occur in the molding to form paths from the outside of the molding to the surface of the lead frame. The moisture which reaches the IC surface causes undesirable destructive corrosion of the semiconductor constituting the IC chip and leads to malfunction of the chip operation.

FIG. 1 is an illustration showing how defect are formed in the packaged IC device. The structure comprises an IC semiconductor chip 28 mounted on a base frame 35' by means of an organic adhesive 24, leads 37 with which the IC chip 28 is electrically coupled by means of Au wiring 39 and epoxy molding enclosing the IC chip and lead frames 35 and 37. When the IC chip was dieattached on the base plate 35' at a temperature from 100 to 450° C., gases have been usually discharged from the organic adhesive 24 so that organic films 24' have been formed on the lead frames, especially, on the rear surface of the lead frame. The surface of the frame has been also usually oxidized and formed suboxide films 24, 24' and 32 on the surface. In this structure, moisture tends to gather near the interface between the frame and the molding. When the IC device is arranged on an electrical circuit board, soldering is performed by dipping the IC device in a molten solder at 260° C. for 3 to 10 seconds. The rapid change in temperature often causes cracks in the molding as designated by 33 and 31. Also, the moisture trapped around the frames is evaporated and causes swelling 41' to form a cavity 42 by the force of the vapor pressure resulting in cracks 33'. This swelling is particularly likely since the organic films or the oxide film 32 and 24' weaken the adherence power of the molding to the frame.

In particular, organic films and suboxide films which might be formed on the rear surface of the lead frame in advance of molding inhibit the sturdy connection between the rear surface and the molding material and eventually produce the swelling 41'.

SUMMARY OF THE INVENTION

It is therefore an object of the present invention to provide a reliable electric device and manufacturing the same which is immune to moisture or other impurities invading through cracks or other paths of a package enclosing the device.

In order to accomplish the above and other advantages and objects, the rear surface of the lead frames are coated with antioxidation films of a thickness of 300 to 5000 Å in advance of the molding process of IC devices and means such as a glass-type silver paste which discharges little amount of gases are utilized for mounting the IC chip on the lead frame.

BRIEF DESCRIPTION OF THE DRAWING

This invention can be better understood from the following detailed description when read in conjunction with the drawing in which.

DETAILED DESCRIPTION OF THE PREFERRED EMBODIMENTS

Figure 2:
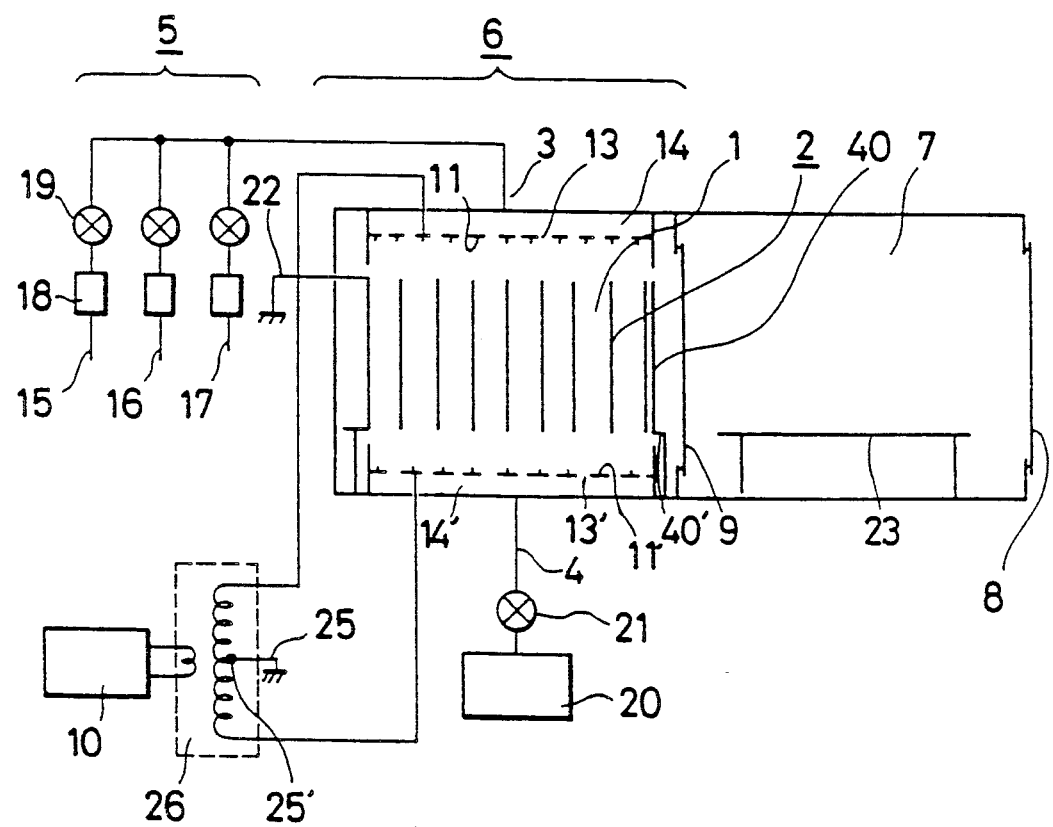
FIG. 2 is a schematic diagram showing a plasma CVD apparatus for use in embodying the present invention.

Referring now to FIGS. 2 and 3(A) to 3(C), a plasma processing method in accordance with an embodiment of the present invention is described. FIG. 2 is a schematic cross sectional diagram showing a plasma CVD apparatus. The apparatus comprises a deposition chamber 1, a loading-unloading chamber 7 coupled with the deposition chamber 1 through a gate valve 9, a pair of mesh or grid electrodes 11 and 11' provided in the deposition chamber 1, a gas feeding system 5, a vacuum pump 20 connected to the chamber 1 through a valve 21, and a high frequency power source 10 for supplying electric energy between the electrodes 11 and 11' through a transformer 26. The mid point 25' of the secondary coil of the transformer 26 is grounded at point 25. The gas feeding system includes three sets of flow rate meters 18 and valves 19. The high frequency energy inputted to the electrodes 11 and 11' causes positive column glow discharge therebetween. The glow discharge region (deposition region) is confined by a four-sided frame 40 in order to avoid undesirable deposition outside the region. The frame 40 is supported by a supporter 40' and may be a grounded metal frame or an insulating frame. Within the deposition region, a number of substrate assemblies 2 are supported by the frame 40 and disposed in parallel with intervals of 2 to 13 cm, e.g. 6 cm. A plurality of lead frames are mounted on each assembly 2.

Figure 3A:
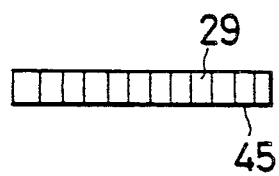
FIG. 3(A) is a schematic plan view showing the entirety of a lead frame structure for supporting IC devices in accordance with the present invention.
Figure 3B:
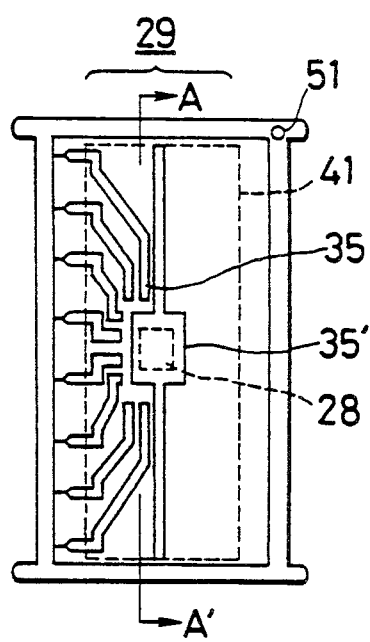
FIG. 3(B) is a partial expanded view of the unit structure of the lead frame illustrated in FIG. 3(A).
Figure 3C:
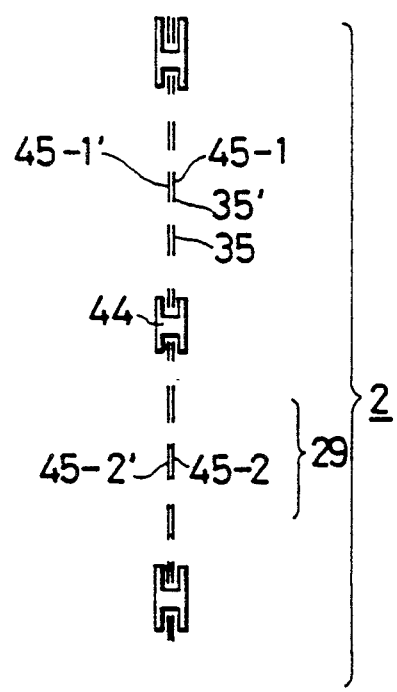
FIG. 3(C) is a partial cross sectional view taken along A—A' line of FIG. 3(B).

The chip assembly is comprised of holding jigs 44 and lead frames 45 interposed and supported between the adjacent jigs 44 as illustrated in FIGS. 3(B) and 3(C). FIG. 3(B) shows a unit structure 41 of the process. FIG. 3(B) shows a unit structure 41 of the lead frame corresponding to leads necessary for one chip, which unit structure is defined by broken line, but the illustration of the structure in the right side of the chip is omitted in the figure. The unit structure repeatedly appears along the frame between the upper and lower rails of the frame as shown in FIG. 3(A). One frame contains 5 to 25 unit structures, e.g. 12 units. A number of the jigs 44 are integrally assembled in order to accommodate 5 to 300 lengths of frames, e.g. 10 therebetween as shown in FIG. 3(C). In this figure, the frames are supported in grooves of the jigs 44. Alternatively, the frames can be suspended at holes 51 by pins (not shown) formed on the jigs. These frames are made from 42 alloy or copper.

These frames are supported by the jigs 44 in face-to-face relationship in order that deposition takes place only on the rear surface and the side surface of the frames as shown in FIG. (C).

Next, protective film coating process in accordance with the present invention will be explained. A number of lead frames are mounted on the assemblies 2. The assemblies are disposed in the deposition chamber at a constant interval through the loading-unloading chamber 7.

In advance of actual deposition, the external surfaces of the lead frames are cleaned. Particularly, suboxide films are removed from the lead frame surfaces. After evacuating the deposition chamber 1, argon gas is introduced into the deposition chamber 1 at 0.001 to 1 Torr from the gas feeding system 5 through a gas inlet 3. The argon gas is then converted to its plasma state by inputting energy of 1 kW at 13.56 MHz in order to form glow discharge and carry out plasma cleaning for 10 to 30 minutes. By this cleaning, suboxide films formed on the surfaces of the lead frames are eliminated. Next, $NH_3$, $Si_2H_6$ and $N_2$ (carrier gas) are introduced through the gas inlet 3 at 0.01 to 1 Torr into the deposition chamber 1 respectively from the introduction ports 15, 16 and 17 at appropriate pressures. The introduction molar ratio of $NH_3/Si_2H_6/N_2$ is 1/3/5. Positive column glow discharge takes place when high frequency energy is input to the pair of electrodes 11 and 11' at 1 kW and 1 to 500 MHz, e.g. 13.56 MHz. As a result, there is deposited silicon nitride coating, as an antioxidation film, on the rear surface of the lead frame. The thickness of the coating reaches to 1000±200 angstroms by continuing the deposition for 10 minutes. The average deposition speed is about 3 Å/sec.

After completing the deposition, the assemblies are removed from the chamber and undergo chip mounting process. IC chips are mounted on the center base portions of the lead frames, which are designated by numeral 28 in FIG. 3(B) as defined by broken line. For mounting IC chips on the lead frames, means such as a glass-type silver paste which discharges little amount of gases are used. A glass-type silver paste was developed by Johnson Matthey Co. in U.S. and was first reported at ISHM in 1982. The chip mounting process is as follows;

The glass-type silver paste used in this embodiment comprises Terpineol as its main ingredient and a little amount of an organic resin which completely sublimes at low temperatures. The IC chip is pressed against and mounted on the surface of the die with the paste in-between, following which it is dried so that the organic materials in the paste are removed. After that, the temperature is elevated at 70–100° C./minute and the device is baked at 420–450° C. for 0.5–3 minutes. In this way, the IC chip is mounted on the lead frame.

The electrical connection is made between the termination of the IC chips and the circumferential leads of the frame by use of Au wiring. Each assembly is then placed on a molding apparatus as it is. An epoxy material (410B) is injected to an appropriate portion around each chip with suitable molds and form an external chip package. Sample devices were produced in accordance with the above embodiment and underwent tests in order to analyze the content of gaseous materials discharged from the glass-type silver paste. For reference, the same tests were carried out upon samples whose chips were mounted by the Au-Si alloy method and a method using polyimide-carried Ag paste. Table 1 shows the test results.

TABLE 1

|  | $H_2O$ (ppmV) | $O_2$ (%) | $CO_2$ (%) | $H_2$ (%) | $N_2$ (%) |
|---|---|---|---|---|---|
| Au—Si | 3000 | 15.5 | 3.6 | ND | 78 |
| glass/Ag | 2000 | 15.2 | 3.4 | ND | 81 |
| polyimide/Ag | 20000 | 0.02 | 24.9 | 0.3 | 72 |

ND: not dated

As can be seen from the table, the volume of the gases discharged from the glass-type silver paste was as low as that from Au-Si. Also, an polyimide-type silver paste (polyimide + 90 wt% Ag) discharges water ten times more in volume than the glass-type silver paste.

After removing the assembly from the molding apparatus, the IC chips are separated from the frames by cutting the ends of the leads. Each lead, which extends beyond the molding structure, is then bent downwardly in order to form the legs of an "IC worm". The leads are cleaned by acid washing, followed by solder plating.

Figure 4:
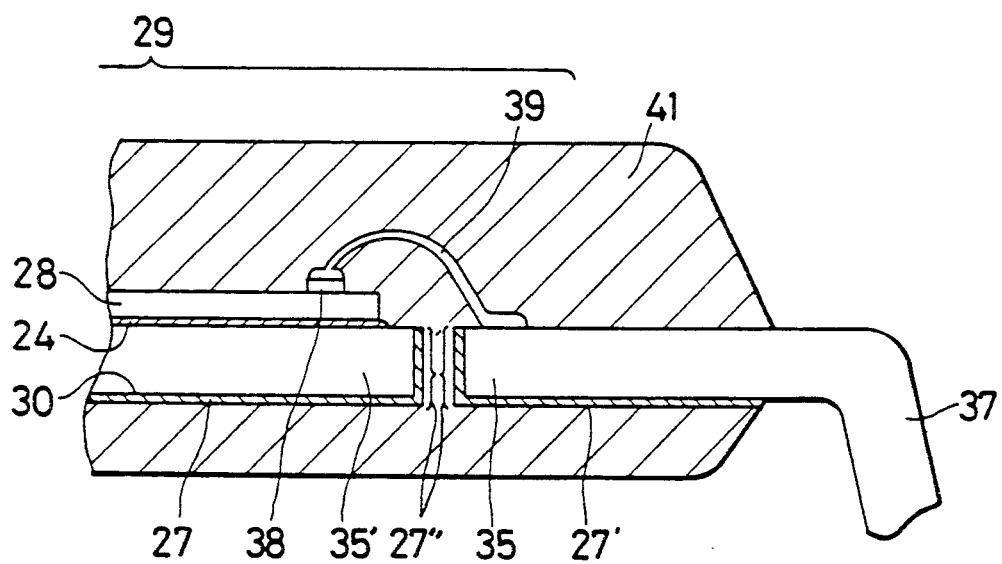
FIG. 4 is a partial cross section showing an IC device in accordance with the present invention.

The internal structure of the molding structure is illustrated in FIG. 4 in details. As shown in the figure, an IC chip 28 is mounted on a base 35' by means of glass-type silver paste 24 and electrically coupled with the leads 37. The antioxidation films 27 and 27' of silicon nitride is covering the rear surfaces and the side surfaces of the lead 35 and the base 35' made of 42 alloy. By virtue of the antioxidation films, it is avoided that the likelihood of separation of molding from the rear surface of the lead frames is increased by suboxide films which would, otherwise, be formed on the surface before the molding process. In accordance with experiments, the IR absorbing spectrum of the antioxidation films showed a peak at 864 cm$^{-1}$ which is indicative of Si-N bonding. The withstanding voltage level of the insulating coating was measured to be $8 \times 10^5$ ohm centimeters. The reflective index of the coating was measured to be 2.0.

In place of the above example, another example is adaptable. That is, the IC chip is first mounted on the base plate by the use of the glass-type silver paste, and the IC chip and the lead are electrically connected each other by wire bonding and then the antioxidation film is formed not only on the rear surface of the lead frame but on the entire surface of the device including lead frame, the IC chip and the wire. The mounting process and the film forming process in this case are same as those of the former example except for the face to face relationship of the frames shown in FIG. 3(B). The metal surfaces of the lead frame or the IC chip are not corroded even though they are covered with the silicon nitride film because there is no gas discharge after the film has been coated.

Figure 1:
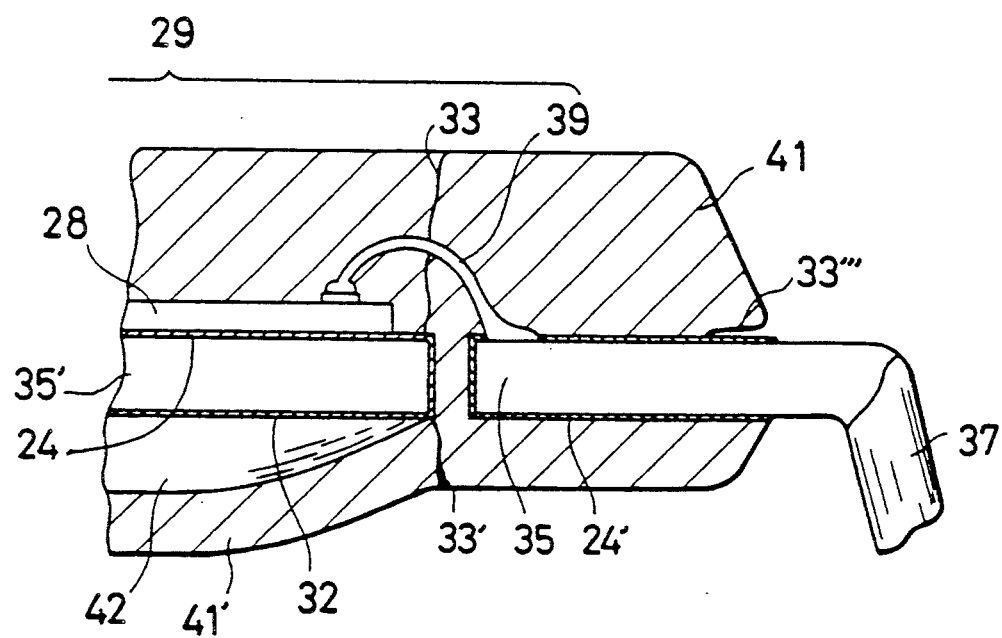
FIG. 1 is an explanatory cross section showing drawbacks of prior art electric devices.

After kept in an atmosphere of 85° C. and 85% (relative humidity) for 100 hours, the 250 IC devices of each examples were dipped in melting solder at 260° C. for 5 seconds in order to make electrical connection with circuits on a circuit board. However, no cracks or no swelling appeared. Furthermore, after they were kept in the atmosphere of 85° C. and 85% (relative humidity) for 3000 hours no defects were observed. On the other hand, 580 electric devices which were provided with antioxidation films but utilize polyimide-type silver paste instead of the glass-type silver paste, were subjected to a test for durability. 80 of the samples had defects such as shown in FIG. 1 before the test was performed. As a result, 30 out of the remaining 500 samples had some defects after the test.

While several embodiments have been specifically described by way of examples, it is to be appreciated that the present invention is not limited to the particular examples described and that modifications and variations can be made without departing from the scope of the invention as defined by the appended claims. Some examples are as follows.

Diamond like carbon, silicon carbide or other insulating material can be deposited to form the antioxidation films. Although the embodiment was IC chip, the present invention can be applied to other electric devices, such as resistors and capacitors.

The plasma deposition or cleaning can be made more effective when the plasma is energized further by illumination of IR light rays having wavelengths of 10 to 15 micrometers or UV light rays having wavelengths no longer than 300 manometers.

In the above embodiment, the lead frames are of the dual-in-line type. However, the present invention can be applied to other types of lead frames such as the flat pack type.

What is claimed is:

1. An electric device comprising:
a leadframe made of a meal or alloy;
an electronic part mounted on a surface of said leadframe by using an adhesive; and
an enclosure made of an organic material enclosing said electronic part,
wherein the adhesion of said organic material to said leadframe is enhanced by using a glass-type silver paste as said adhesive and by forming an antioxidation film on a back surface of the leadframe which is opposite to the surface on which said electronic part is mounted
and wherein said antioxidation film is 300–4000Å thick.

2. The device of claim 1 wherein said antioxidation film is selected from the group consisting of silicon nitride, silicon carbide and diamond like carbon.

3. The device of claim 1 wherein said electronic part is an IC chip.

4. The device of claim 1 wherein said lead frame is made of copper.

5. The device of claim 1 wherein said leadframe is made of a 42 alloy.

6. An electric device comprising:
a leadframe made of a metal or alloy;
an electronic part mounted on a surface of said leadframe by using an adhesive; and
an enclosure made of an organic material enclosing said electronic part,
wherein the adhesion of said organic material to said leadframe is enhanced by using a glass-type silver paste as said adhesive and by forming an antioxidation film on a back surface of the leadframe which is opposite to the surface on which said electronic part is mounted and
wherein said glass-type silver paste includes a gaseous material which comprises $H_2O$ at 1000 ppmV, $O_2$ at 15.2 vol%, $CO_2$ at 3.4 vol% and $N_2$ at 81 vol%.

7. The device of claim 6, wherein said antioxidation film is made of silicon nitride.

8. The device of claim 6, wherein said electronic part is an IC chip.

9. The device of claim 6, wherein said leadframe is made of copper.

10. The device of claim 6, wherein said leadframe is made of a 42 alloy.

* * * * *